United States Patent
Majhi et al.

(10) Patent No.: US 10,388,869 B2
(45) Date of Patent: Aug. 20, 2019

(54) RARE EARTH METAL AND METAL OXIDE ELECTRODE INTERFACING OF OXIDE MEMORY ELEMENT IN RESISTIVE RANDOM ACCESS MEMORY CELL

(71) Applicant: Intel Corporation, Santa Clara, CA (US)

(72) Inventors: Prashant Majhi, San Jose, CA (US); Elijah V. Karpov, Santa Clara, CA (US); Niloy Mukherjee, Portland, OR (US); Ravi Pillarisetty, Portland, OR (US); Uday Shah, Portland, OR (US); Brian S. Doyle, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 15/505,905

(22) PCT Filed: Sep. 25, 2014

(86) PCT No.: PCT/US2014/057470
§ 371 (c)(1),
(2) Date: Feb. 22, 2017

(87) PCT Pub. No.: WO2016/048327
PCT Pub. Date: Mar. 31, 2016

(65) Prior Publication Data
US 2018/0219154 A1 Aug. 2, 2018

(51) Int. Cl.
*H01L 45/00* (2006.01)

(52) U.S. Cl.
CPC ............ *H01L 45/146* (2013.01); *H01L 45/08* (2013.01); *H01L 45/12* (2013.01);
(Continued)

(58) Field of Classification Search
CPC . H01L 45/04; H01L 45/1226; H01L 45/1233; H01L 45/1608; H01L 45/1633
See application file for complete search history.

(56) References Cited

U.S. PATENT DOCUMENTS

| 8,525,142 B2 | 9/2013 | Bourim et al. |
| 2010/0178729 A1 | 7/2010 | Yoon et al. |

(Continued)

FOREIGN PATENT DOCUMENTS

| JP | 2007300082 | 11/2007 |
| JP | 2008177469 | 7/2008 |

(Continued)

OTHER PUBLICATIONS

International Search Report and Written Opinion for PCT/US14/57470 dated Jun. 25, 2015, 15 pages.

(Continued)

*Primary Examiner* — Phuc T Dang
(74) *Attorney, Agent, or Firm* — Green, Howard, & Mughal LLP

(57) ABSTRACT

Thin film resistive memory material stacks including at least one of a high work function metal oxide at an interface of a first electrode and a thin film memory material, and a low work function rare earth metal at an interface of a second electrode and the thin film memory material. The high work function metal oxide provides a good Schottky barrier height relative to memory material for high on/off current ratio. Compatibility of the metal oxide with switching oxide reduces cycling loss of oxygen/vacancies for improved memory device durability. The low work function rare earth metal provides high oxygen solubility to enhance vacancy creation within the memory material in as-deposited state for low forming voltage requirements while providing an ohmic contact to the resistive memory material.

12 Claims, 10 Drawing Sheets

(52) U.S. Cl.
CPC ...... *H01L 45/1226* (2013.01); *H01L 45/1233* (2013.01); *H01L 45/16* (2013.01)

(56) References Cited

U.S. PATENT DOCUMENTS

| | | | |
|---|---|---|---|
| 2011/0068409 A1* | 3/2011 | Kim | H01L 29/66666 257/379 |
| 2011/0073828 A1 | 3/2011 | Xia et al. | |
| 2012/0280201 A1 | 11/2012 | Sekar et al. | |
| 2012/0305878 A1* | 12/2012 | Miller | H01L 45/085 257/4 |
| 2012/0313069 A1* | 12/2012 | Wang | H01L 45/04 257/4 |
| 2013/0130464 A1 | 5/2013 | Lee et al. | |
| 2014/0091272 A1* | 4/2014 | Liao | H01L 45/08 257/4 |
| 2014/0268993 A1 | 9/2014 | Chiang et al. | |

FOREIGN PATENT DOCUMENTS

| | | |
|---|---|---|
| JP | 2014036034 | 2/2014 |
| KR | 1020090108221 | 10/2009 |
| WO | 2014031617 | 2/2014 |

OTHER PUBLICATIONS

Extended European Search Report for European Patent Application No. 149023798, dated May 4, 2018
Office Action dated Sep. 14, 2018 for Japanese Patent Application No. 2017-510341.
First Office Action dated Oct. 22, 2018 for Taiwan Patent Application No. 104127006.
EP Communication pursuant to Article 94(3), dated Mar. 28, 2019 for European Patent Application No. 14902379.8-1212.
Office Action dated May 1, 2019 for Japanese Patent Application No. 2017-510341 Computer translation.

* cited by examiner

RARE EARTH METAL AND METAL OXIDE ELECTRODE INTERFACING OF OXIDE MEMORY ELEMENT IN RESISTIVE RANDOM ACCESS MEMORY CELL

CLAIM OF PRIORITY

This application is a National Phase Application of, and claims priority to, PCT Application No. PCT/US14/57470, filed on 25 Sep. 2014, titled "RARE EARTH METAL & METAL OXIDE ELECTRODE INTERFACING OF OXIDE MEMORY ELEMENT IN RESISTIVE RANDOM ACCESS MEMORY CELL", which is incorporated by reference in its entirety for all purposes.

BACKGROUND

Nonvolatile memory (NVM) is a form of memory widely utilized in the microelectronics industry. To date, the dominant form of NVM has been flash (e.g., NAND, NOR, etc.). Many alternative NVM technologies are under development for next generation devices. One of the considerations for next-gen NVM technology is how readily it can be integrated with CMOS logic circuitry. Embedded non-volatile memory (e-NVM) is a non-volatile memory integrated on-chip with logic devices (e.g., fabricated in CMOS technology). e-NVM is distinct from stand-alone NVM where the memory array is fabricated on a substrate dedicated to the memory. Embedded NVM advantageously eliminates the need for inter-chip communication between a processor and off-chip memory, and consequently enables high-speed data access and wide bus-width capability for any logic implemented on-chip along with the e-NVM (e.g., cores of a CPU, graphics processor execution unit, etc.).

Of the various NVM technologies, resistive memory technologies continue to show significant promise both for discrete and e-NVM applications. In a resistive memory, such as resistive random-access memory (ReRAM or RRAM), the thin film memory stack is generally a two-terminal device of the form illustrated in FIG. 1A. For thin film resistive memory material stack 101, a comparatively insulating memory material 115 capable of non-volatile switching is disposed between two relatively more conductive electrodes 105, 130. The memory material can switch between two different non-volatile states: a high-resistance state (HRS), which may be representative of an "off" or 0 state; and a low-resistance state (LRS), which may be representative of an "on" or 1 state. Typically, a reset process is used to switch the ReRAM device to the HRS using a reset voltage, and a set process is used to switch the ReRAM device to the LRS using a set voltage. To reduce off-state leakage of a resistive memory array, a resistive memory bitcell often includes an access transistor (1T) or a thin film selector element (1S) along with the resistive memory element (1R).

Forming voltage and cell endurance are two important metrics for thin film resistive memory technology. The forming voltage is to impart the memory element with the ability to switch. Because of the limited operating voltage found in state of the art CMOS (e.g., $V_{cc}$<0.9V), achieving a sufficiently low forming voltage is particularly challenging for e-NVM applications. As further depicted in FIG. 1A, defects 116 are engineered in memory material 115 to enable modulation of electrical conduction through the film thickness. Defects 116 are currently thought to be primarily oxygen vacancies. Addition of an oxygen exchange layer (e.g., Ti cap 121) between an electrode and the memory element has been found to promote creation of oxygen vacancies, and lower forming voltages as further illustrated in FIG. 1B. An oxygen exchange layer of Ti, Hf, Zr, or Ta has been typically utilized for the various binary and ternary metal oxides evaluated for the switchable memory material.

Memory cell reliability is generally characterized with a number of set/reset cycles. Historically, resistive memory cell reliability/endurance has been poor and although it has gradually improved over the last decade it remains in the range of $10^{11}$-$10^{12}$ set/reset cycles, which may limit the use cases/applications for the technology.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
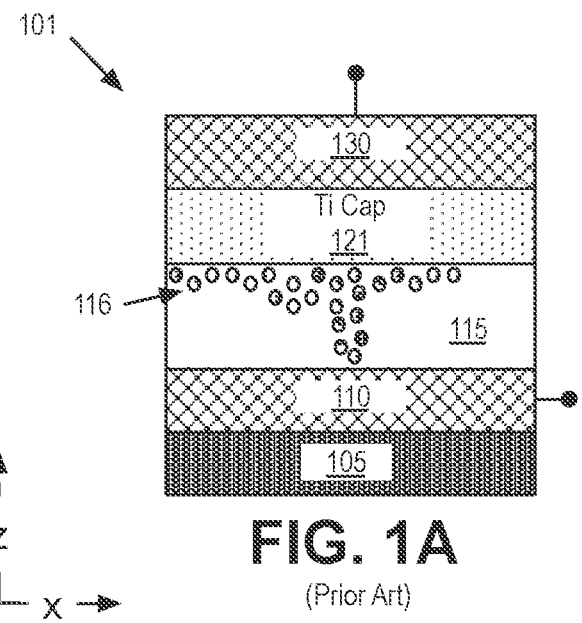
FIG. 1A is a cross-sectional view of a conventional thin film resistive memory stack.
Figure 1B:
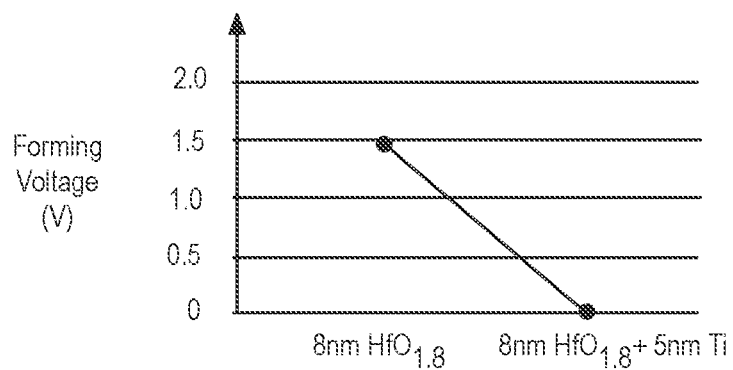
FIG. 1B is a graph illustrating an effect of a conventional Ti capping layer on a forming voltage associated with a thin film resistive memory stack.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in the description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are thin film resistive memory material stacks including at least one of a high work function metal oxide at an interface of a first electrode and a thin film memory material, or a low work function rare earth metal at an interface of a second electrode and the thin film memory material. In advantageous embodiments, a memory material forms a first interface with the high work function metal oxide and a second interface with the low work function rare earth metal. The high work function metal oxide provides a good Schottky barrier height relative to memory material for high on/off current ratio. Compatibility of metal oxide with switching oxide reduces cycling loss of oxygen/vacancies for improved memory device durability. The low work function rare earth metal provides a high oxygen solubility to enhance vacancy creation within the memory material in as-deposited state for low forming voltage requirements while maintaining an ohmic contact. Also described herein are planar and non-planar memory stacks and devices, resistive memory arrays, and SoC including such arrays as e-NVM.

Figure 2A:
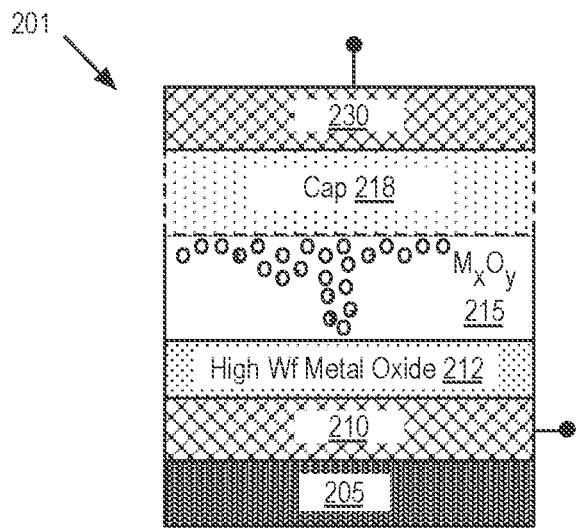
FIG. 2A is a cross-sectional view of a thin film resistive memory stack incorporating a high work function metal oxide between a memory material and a first electrode, in accordance with an embodiment.

FIG. 2A is a cross-sectional view of a thin film resistive memory stack 201 disposed over a substrate 205. Stack 201 incorporates a work function electrode material 212 between a thin film memory material 215 and a bottom (first) bulk electrode material 210, in accordance with an embodiment. Bottom electrode material 210 and top (second) electrode material 230 are an anode/cathode pair of electrodes coupled to opposite interfaces of stack 201.

Substrate 205 may be any substrate known to be suitable for supporting a thin film 1T(S)1R bitcell, such as, but not limited to: crystalline semiconductor materials, including, but not limited to, silicon, germanium, and SiGe, etc.; and amorphous materials including glasses, organic polymers, and plastics, etc. In further embodiments, substrate 205 further represents a back end of line (BEOL) layer. For example stack 201 may be formed on or above an underlying semiconductor device layer of an integrated circuit (IC). As such, substrate 205 may also include thin film laminates (e.g., metals, dielectrics, etc.) commonly found in IC industry.

Memory material 215 is switchable between a high resistance state and a low resistance state to store one of a "1" or "0" associated with the bi-stable memory cell states. Memory stack 201 may be further integrated with a thin film selector element (not depicted) in a 1R1S bitcell or a MOSFET (not depicted) in a 1R1T bitcell that may be replicated within an array of resistive memory cells. The resistive memory stack 201 is bidirectional. The selector element or transistor is associated with some threshold voltage $V_{th}$, below which current memory stack 201 is at some nominal leakage level while in an "OFF" state. Above threshold voltage $V_{th}$, selector or transistor is in the "ON" state and passes some threshold current that may increase substantially linearly to enable a reading of resistance state for the memory material 215 at a read voltage $V_r$, and a transitioning of resistance state for memory material 215 at higher voltage magnitudes (e.g., set/reset voltage).

In embodiments, memory material 215 includes a thin film metal oxide (e.g., $M_xO_y$) material. Advantageously, memory material 215 consists only of a metal oxide thin film (i.e., memory material 215 is not a laminate including a non-metal oxide). The metal oxide is to change resistance values between high and low resistance states in a non-volatile fashion when opposite polarity voltages are applied across electrodes 210, 230. In some embodiments the metal oxide can undergo reversible metal-insulator transition (e.g., Mott transition, charge induced transition, or the like). In some embodiments the metal oxide material is conductive in bulk and/or thin film form. In one exemplary embodiment, the metal oxide is a transition metal oxide including stoichiometric and sub-stoichiometric ionic oxides $AO_x$, where A is a transition metal. In certain such embodiments, the metal oxide is an anionic-based oxide material. Non-limiting examples of anionic-based oxides include, but are not limited, to oxides of V (e.g., $V_2O_5$), Nb (e.g., $Nb_2O_5$), Cr (e.g., $Cr_2O_3$), Ta (e.g. $Ta_2O_5$), Hf (e.g. $HfO_2$), Zr (e.g., $ZrO_2$), Ti (e.g., $TiO_2$), W (e.g., $WO_2$) or Al (e.g., $Al_2O_3$), as well as ternary, quaternary alloys such as $SnO_2$-doped Indium oxide, as well as oxide alloys with metals from the columns of periodic table adjacent to the primary metal (e.g., Y, Zr in $Y_2O_3$-doped $ZrO_2$ and Sr and La in $La_{1-x}Sr_xGa_{1-y}Mg_yO_3$). The anionic-based oxides may also be non-stoichiometric oxides of these same elements and their alloys. In other such embodiments, the metal oxide is a cationic-based oxide material, examples of which may include but are not limited to $LiMnO_2$, $Li_4TiO_{12}$, $LiNiO_2$, and $LiNbO_3$.

Memory material 215 may have a film thickness that varies considerably as a function of composition, read, set/reset voltage requirements, etc. In exemplary metal oxide embodiments, such as those employing any of the metal oxide materials described above, the metal oxide has a thin film thickness of at least 2 nm, less than 50 nm, and advantageously no more than 20 nm.

First and second electrode materials 210, 230 may have the same composition or differ and may further include one or more thin film layers. Electrode material 210 for example is functionally to conduct memory cell currents over lateral distances as contact metallization function is provided by the work function electrode material 212. In exemplary embodiments, electrode material 210 is a metal or metal alloy commonly employed for interconnect routing in the IC industry, such as copper (Cu), aluminum (Al), and alloys thereof. In embodiments, electrode material 230 is also an interconnect metal, such as Cu.

In the illustrated embodiment, work function electrode material 212 makes direct contact to memory material 215. Work function electrode material 212 is further in direct contact with electrode material 210 (e.g., a low resistance bulk material such as Cu), thereby functioning as a first contact interface for memory material 215. In embodiments, work function electrode material 212 has a high work function, advantageously greater than 4.8 eV (289K), to provide a high Schottky barrier to a metal oxide memory material. In further embodiments, electrode material 212 does not bond strongly to oxygen, allowing an exchange of oxygen with memory material 215 during memory cell operation. Advantageously, work function electrode material 212 is further a good thermal insulator, enabling a fast reset of memory material 215. In further embodiments, work function electrode material 212 is a metal oxide, which improves endurance/stability of the interface between work function electrode material 212 and memory material 215, particularly where memory material 215 is also a metal oxide.

In embodiments, work function electrode material 212 is a non-switching metal oxide having a composition distinct from memory material 215 and exemplary metal oxides possessing the above attributes include an oxide of at least one of Ir, Ru, Mo, or W. In further embodiments, work function electrode material 212 is an elemental oxide of at least one of Ir (e.g., $IrO_2$), Ru (e.g., $RuO_2$), Mo (e.g., $MoO_2$), or W (e.g., $WO_2$). In further embodiments, work function electrode material 212 is a mixed oxide (e.g., ternary oxide including one of Ir, Ru, Mo, or W and another metal). In one advantageous mixed oxide embodiment, work function electrode material 212 is a mixed oxide of at least two of Ir, Ru, Mo, or W. The above exemplary conductive metal oxides have the advantage of being relatively stable when subjected to the electric field and thermal cycling demands of a resistive memory device. The above exemplary conductive oxides may also have good diffusion barrier properties (e.g., amorphous, non-reactive), and therefore reduce the rate of intermixing with the adjacent memory oxide 215. The exemplary conductive oxides also have reasonably low resistivity values, enabling memory stack 202 to be operable at low voltages (e.g., <1.5V). In exemplary embodiments, work function electrode material 212 has a resistivity of less than 1 milli ohm-cm ($\frac{1}{1000}^{th}$ Ohm-cm).

Work function electrode material 212 may have a film thickness that varies considerably as a function the chosen composition's resistivity and the limit on voltage drop that can be tolerated by memory stack 201 in a given application (e.g., discrete NVM vs. e-NVM). Generally, a greater conductive oxide barrier film thickness will provide a better stability at the expense of high resistive voltage drop. In exemplary embodiments, employing any of the conductive metal oxide materials described above, the work function electrode material 212 has a thin film thickness less than 10 nm, and advantageously at least 2 nm but not more than 5 nm.

As further illustrated in FIG. 2A, resistive memory stack 201 may further include a capping layer 218, which for example may function as a contact metal and/or an oxygen scavenging layer. Any conventional material may be utilized as capping layer 218, or a rare earth material as further described below in the context of FIG. 2B may be incorporated into memory stack 201.

Figure 2B:
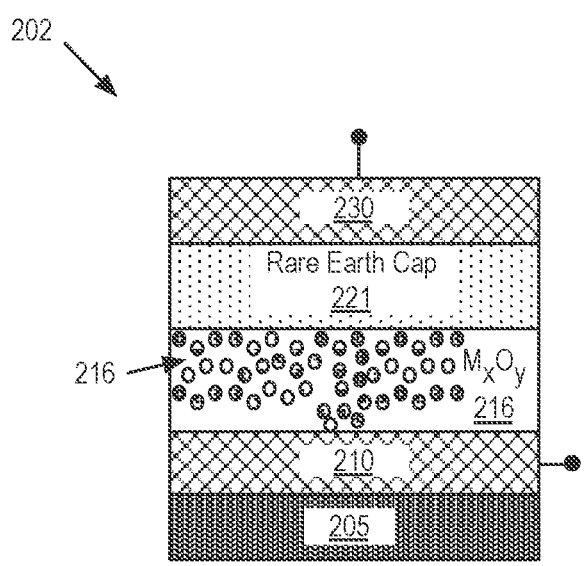
FIG. 2B is a cross-sectional view of a thin film resistive memory stack incorporating a rare earth metal cap between a memory material and a second electrode, in accordance with an embodiment.

FIG. 2B is a cross-sectional view of a thin film resistive memory stack 202 disposed over a substrate 205. Stack 202 incorporates a rare earth metal capping material 221 between a thin film memory material 215 and top (second) bulk electrode material 230, in accordance with an embodiment.

In advantageous embodiments, rare earth capping material 221 is in direct contact with a first interface of memory material 215. Memory material 215 may for example be any of the metal oxides described above in the context of FIG. 2A. Functionally, rare earth capping material 221 is a strong oxygen scavenger with high oxygen solubility while still remaining a metal. Because of a very low enthalpy of oxidation, rare earth capping material 221 advantageously provides a very high number of oxygen vacancies within (metal oxide) memory material 215 in the film stack's as-fabricated state so that forming voltage requirements are reduced, advantageously below 1.5V. Rare earth metals utilized for capping material 221 in accordance with embodiments scavenge oxygen from memory material 215 more aggressively than transition metals such as Ti, Hf, Zr, or Ta. The effect is illustrated by the greater number of defects/oxygen vacancies 216 present in memory material 215 relative to that of memory element 115 illustrated in FIG. 1A.

In embodiments, capping material 221 comprises a rare earth metal having a low work function. A low work function, advantageously below 4.5 eV (298K) and more advantageously below 3.5 eV enables an ohmic contact with electrode material 230. Exemplary rare earth metals that possess both the attributes of advantageously low enthalpy of oxidation and advantageously low work function include Lanthanum (La), Erbium (Er), Gadolinium (Gd), Yttrium (Y), and Praseodymium (Pr). In one such embodiment, capping material 221 is the elemental metal of one of La, Er, Ga, Y, and Pr. In further embodiments, rather than in the pure elemental metal form, capping material 221 is an alloy including at least one of La, Er, Ga, Y, and Pr and one or more other metal (e.g., another rare earth metal or transition metal). Alloyed embodiments may sufficiently retain the desired electrical properties of the pure elemental metal while advantageously rendering capping material 221 more amenable to memory device fabrication (e.g., easier to etch) and/or more stable. One alloyed rare earth capping material embodiment thought to be particularly advantageous includes two or more of La, Er, Ga, Y, and Pr. Such an alloy can maintain an advantageously low work function (e.g., under 3.5 eV) by the addition of one constituent (e.g., Pr) while enabling easier memory stack and/or device fabrication through the addition of another constituent that is easier to process (e.g., Gd).

In further embodiments, as also illustrated in FIG. 2B capping material 215 forms an interface with electrode material 230. In exemplary embodiments, capping material 221 is between 2 nm and 20 nm in thickness. As capping material 221 scavenges oxygen from memory material 215 it forms an oxide (e.g., elemental oxide of one of La, Er, Ga, Y, and Pr) proximal to the interface of memory material 215. Advantageously, capping material 221 is of sufficient thickness that capping material 221 is not completely oxidized with the remaining rare earth metal (e.g., elemental form of La, Er, Ga, Y, and Pr) interfacing electrode material 230 free of oxygen.

Figure 3:
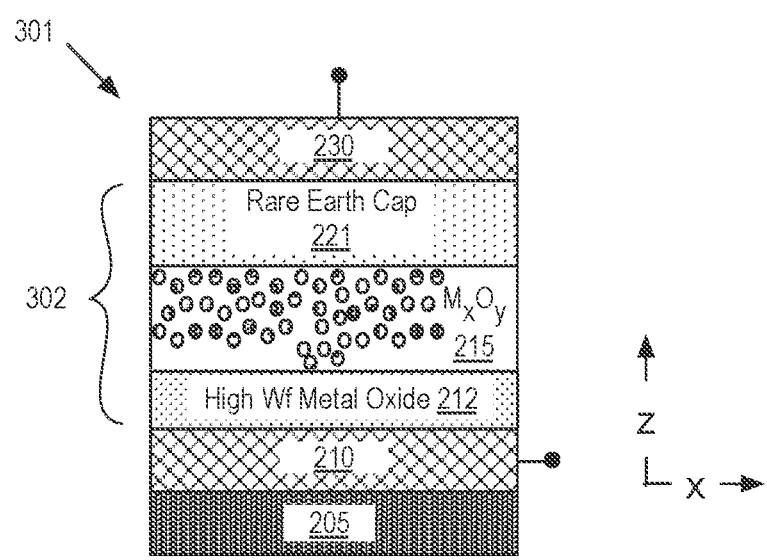
FIG. 3 is a cross-sectional view of a thin film resistive memory stack incorporating a high work function metal oxide between the memory material and a first electrode, and a rare earth metal cap between a memory material and a second electrode, in accordance with embodiments.

FIG. 3 is a cross-sectional view of a thin film resistive memory stack 301 incorporating a (metal oxide) high work function electrode material 212 between memory material 215 and a first electrode material 210, and a rare earth metal cap 221 between a memory material 215 and a second electrode material 230, in accordance with embodiments. Memory stack 301 is one example of memory stack 201 introduced in FIG. 2A further combined with the rare earth capping material 221 introduced in FIG. 2B. Thin film resistive memory stack 301 combines the benefits of each of the memory material interfaces described above to achieve both a low forming voltage and enhanced memory stack endurance. As illustrated in FIG. 3, high work function metal oxide 212 makes a first interface with (metal oxide) memory material 215 while rare earth metal cap 221 makes a second interface with memory material 215. Any of the attributes of high work function electrode material 212 described in the context of FIG. 2A are equally applicable in the context of resistive memory stack 301. Similarly any of the attributes of rare earth metal cap 221 described in the context of FIG. 2B are equally applicable in the context of resistive memory stack 301.

Figure 4:
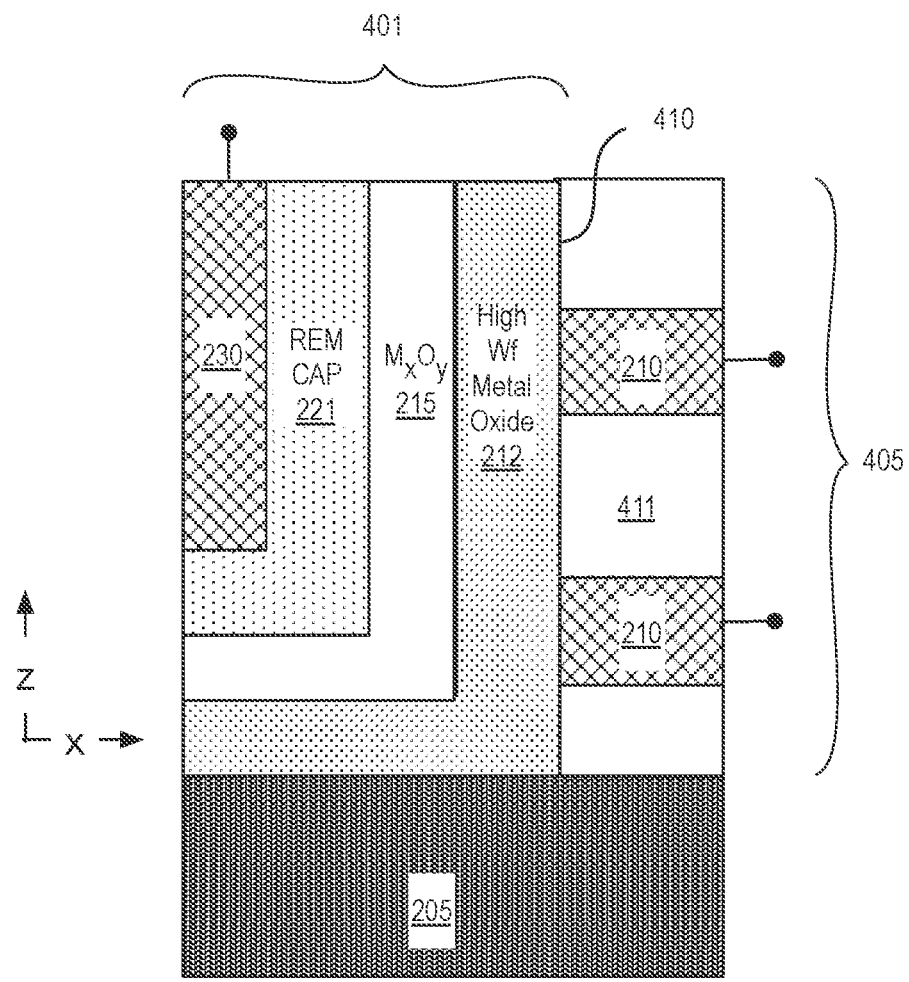
FIG. 4 is a cross-sectional view illustrating a non-planar thin film resistive memory device, in accordance with embodiments.

In embodiments, a non-planar resistive memory stack includes either or both of a high work function electrode material and rare earth capping material. Although the exemplary embodiments illustrated in FIGS. 2A, 2B, and 3 are depicted in a planar context, it is noted the same thin film stacks may be readily implemented into various non-planar architectures. FIG. 4, for example, is a cross-sectional view illustrating a non-planar thin film memory stack 401 incorporating a (metal oxide) memory material 215 interfaced on one side by (metal oxide) work function electrode 212 and interfaced on a second side by rare earth metal (REM) capping layer 221, in accordance with a non-planar embodiment. Each of these thin films, along with electrode material 230, has been deposited on a topographic feature sidewall 410 so that the direction of current flow through memory stack 401 is non-orthogonal to a surface of substrate 205 (e.g., substantially planar with substrate 205). To further increase bitcell density, sidewall 410 may expose a stack of first electrodes 405 laminated with an insulating dielectric 411 intervening between adjacent pairs of first electrodes 210. Assuming the work function electrode material 212 is of sufficiently high electrical and thermal resistivity, the plurality of first electrodes 210 may be independently biased relative to second electrode 203 to provide an independent memory cell stack for each first electrode 210. Each independent memory cell stack has the advantages of the resistive memory stack 301 described in the context of FIG. 3.

Figure 5:
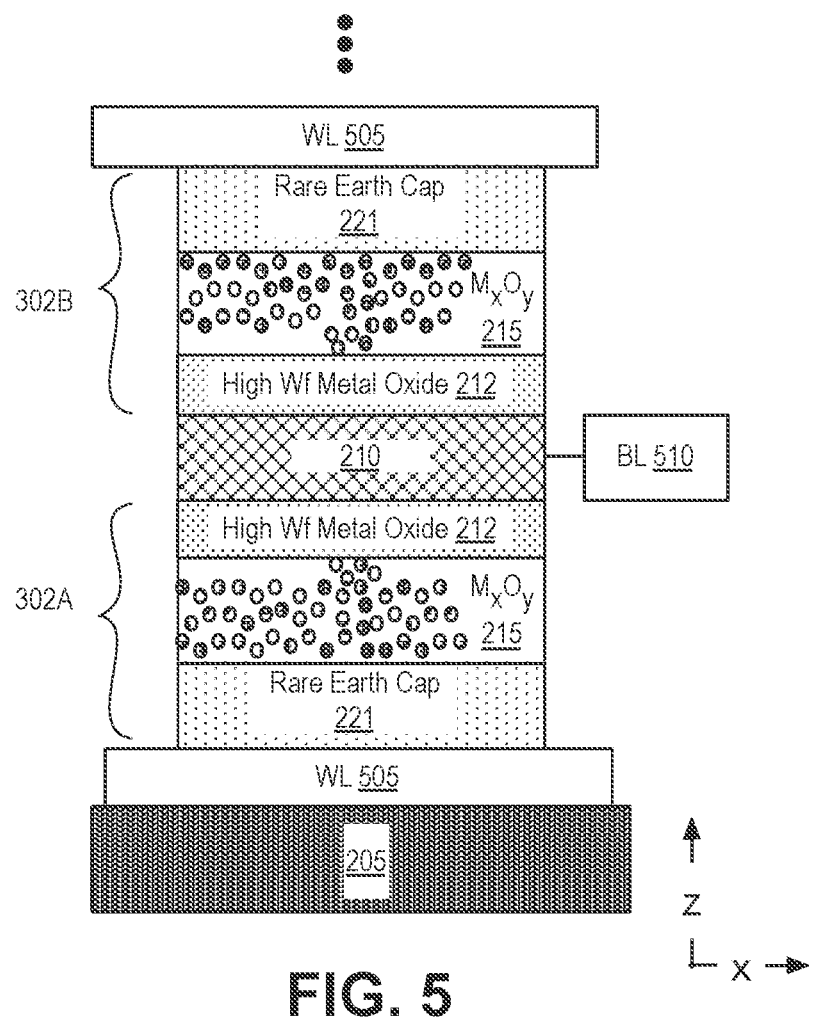
FIG. 5 is a cross-sectional view illustrating stacked thin film resistive memory device, in accordance with embodiments.

FIG. 5 is a cross-sectional view illustrating vertically stacked thin film resistive memory cells, in accordance with embodiments. Resistive memory array density may be increased by vertically stacking any of the memory cell material stacks described above. In the exemplary embodiment illustrated in FIG. 5, a first thin film resistive memory material stack 303A is disposed back-to-back with a second thin film resistive memory material stack 303B between two wordlines 505. A bitline 510 couples to electrode material 210, common to both memory stacks 303A, 303B. Each memory stack 303A, 303B includes a (metal oxide) work function electrode 212 and a rare earth metal capping material 221, substantially as described above.

Figure 6A:
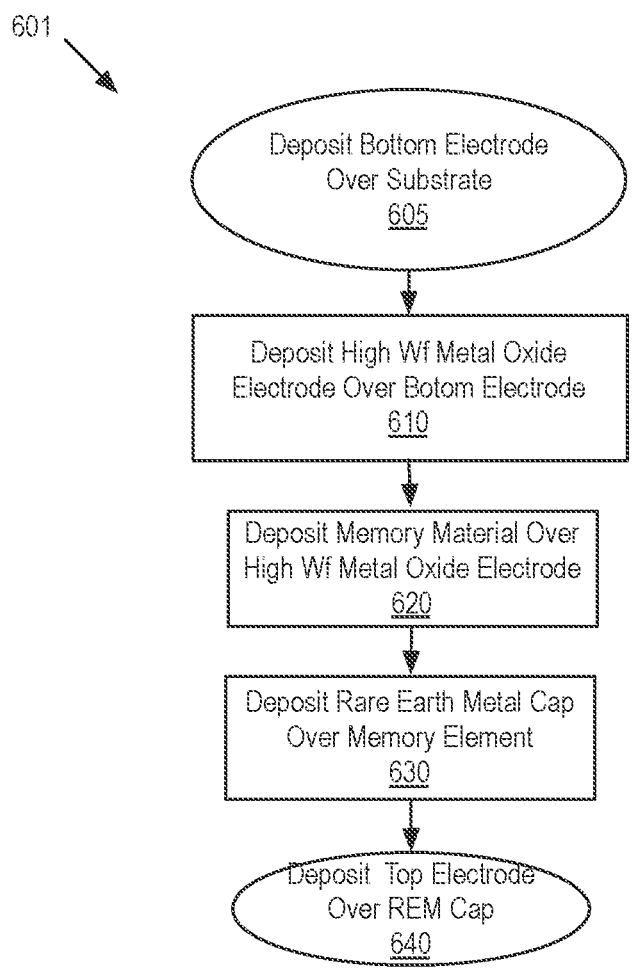
FIG. 6A is a flow diagram illustrating a method of forming a thin film resistive memory device incorporating a rare earth metal cap between a memory material and a top electrode, and a high work function metal oxide between the memory material and a bottom electrode, in accordance with embodiments, in accordance with embodiments.

The memory stack architectures described above may be fabricated by many techniques. FIG. 6A is a flow diagram illustrating a method 601 of forming a thin film resistive memory stack incorporating a high work function electrode material, and a rare earth low work function capping material, in accordance with embodiments. As one example, method 601 may be employed to form memory stack 301 illustrated in FIG. 3.

Method 601 begins at operation 605 with depositing a first (bottom) electrode material over a substrate. Any deposition process know in the art to be suitable for the particular electrode composition may be utilized at operation 605, such as, but not limited to, physical vapor deposition (PVD), chemical vapor deposition (CVD), atomic layer deposition (ALD), electrolytic and electroless plating, and spin-on techniques.

At operation 610 a work function electrode including a metal oxide is deposited over the first electrode material. Any deposition process know in the art to be suitable for the particular conductive metal oxide may be utilized at operation 610, such as, but not limited to, PVD, CVD, and ALD techniques. In one exemplary planar embodiment, reactive or non-reactive PVD is employed at operation 610 to deposit any of the elemental or mixed metal oxides described above in the context of work function electrode material 212. In one exemplary non-planar embodiment, ALD is employed at operation 610 to deposit any of the elemental or mixed metal oxides described above in the context of work function electrode material 212.

At operation 620 a thin film resistive memory material is deposited directly on the work function electrode material that was formed at operation 610. Any deposition process know in the art to be suitable for the particular memory material layer may be utilized at operation 620, such as, but not limited to, PVD, CVD and ALD techniques. In one exemplary planar embodiment, reactive or non-reactive PVD is employed at operation 620 to deposit any of the switching metal oxides described above for memory material 215. In one exemplary non-planar embodiment, ALD is employed at operation 620 to deposit any of the switching metal oxides described above for memory material 215.

Method 601 continues with operation 630 where a capping material including a rare earth metal is deposited directly on the memory material deposited at operation 620. Any deposition process know in the art to be suitable for the particular rare earth metal may be utilized at operation 630 such as, but not limited to, PVD, CVD, and ALD techniques. In one exemplary planar embodiment, non-reactive PVD is employed at operation 630 to deposit any of the elemental or alloyed rare earth metals described above in the context of rare earth capping material 221. In one exemplary non-planar embodiment, ALD is employed at operation 630 to deposit any of the elemental or alloyed rare earth metals described above in the context of rare earth capping material 221.

Method 601 completes at operation 640 with the deposition of another electrode material over, and advantageously directly on, the rate rare earth capping material 221. Any conventional deposition technique capable of preventing oxidation of the rare earth capping material at the interface of the electrode material may be utilized at operation 640. For example, a seed layer may be deposited by PVD or ALD followed by a plating process. For vertically stacked memory cells, method 601 may be repeated, with the various operations performed in the same, or opposite, order.

Figure 6B:
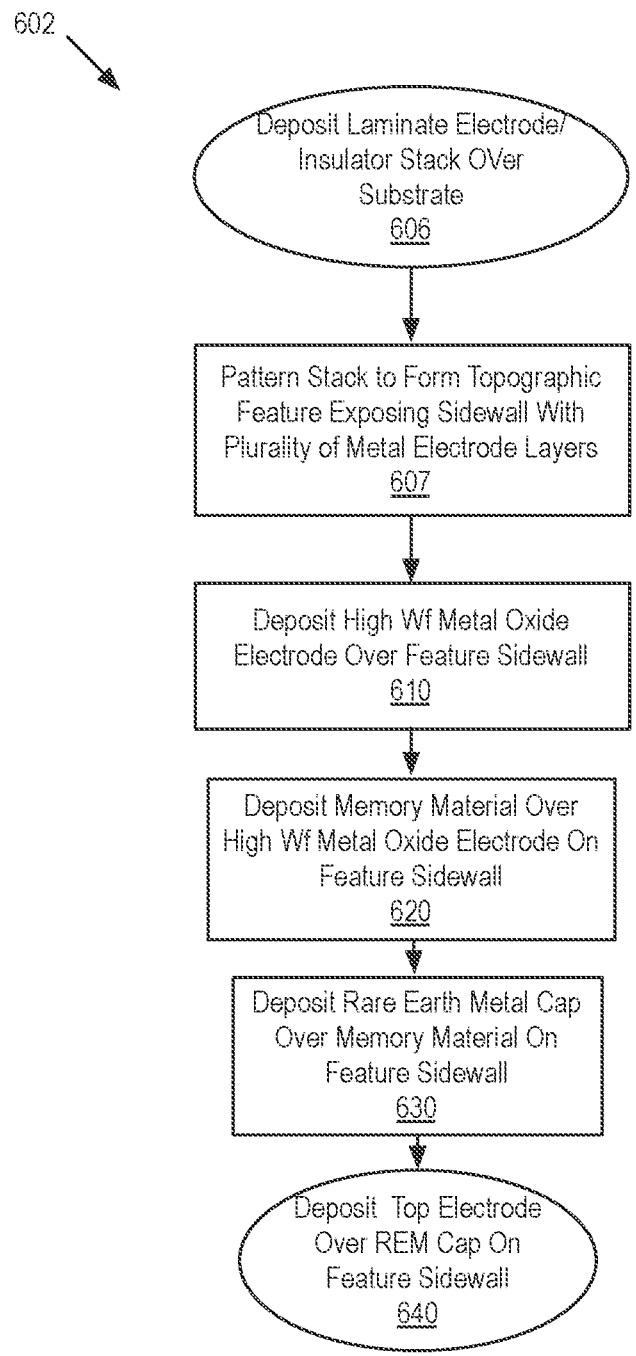
FIG. 6B is a flow diagram illustrating a method of forming a thin film resistive memory device incorporating a rare earth metal cap between a memory material and a top electrode, and a high work function metal oxide between the memory material and a bottom electrode, in accordance with embodiments, in accordance with embodiments.

FIG. 6B is a flow diagram illustrating a method 602 of forming a non-planar thin film resistive memory stack incorporating a high work function electrode, and a rare earth low work function capping material, in accordance with embodiments. As an example, method 602 may be employed to form memory stack 401 illustrated in FIG. 4.

Method 602 begins at operation 606 with depositing a laminate stack of a plurality of metal layers insulated from each other by an intervening dielectric. The electrode deposition operation 605 described in the context of FIG. 6A may for example be iterated with any conventional dielectric deposition process (e.g., CVD of SiO, SiN, SiNO) until a desired number of first electrode layers are formed. At operation 607, the laminate stack is etched through, for example with any conventional lithographic and anisotropic etching process to form a topographic feature exposing a sidewall of the plurality of metal electrode layers.

Method 602 continues at operation 610, with the high work function metal oxide electrode material deposited substantially as described above (e.g., with an ALD process) to form the metal oxide over the topographic feature in direct contact with the sidewall of the plurality of metal layers. At operation 620 the memory material is deposited over the topographic feature substantially as described above and in direct contact with the work function electrode material (e.g., with an ALD process). At operation 640 the capping material is deposited substantially as described above, for example depositing a rare earth metal over the topographic feature and in direct contact with the memory material with an ALD process. Method 602 then completes with deposition of the top electrode over the REM capping layer, for example using an ALD and/or plating process that avoids oxidizing the rare earth capping material.

Figure 7:
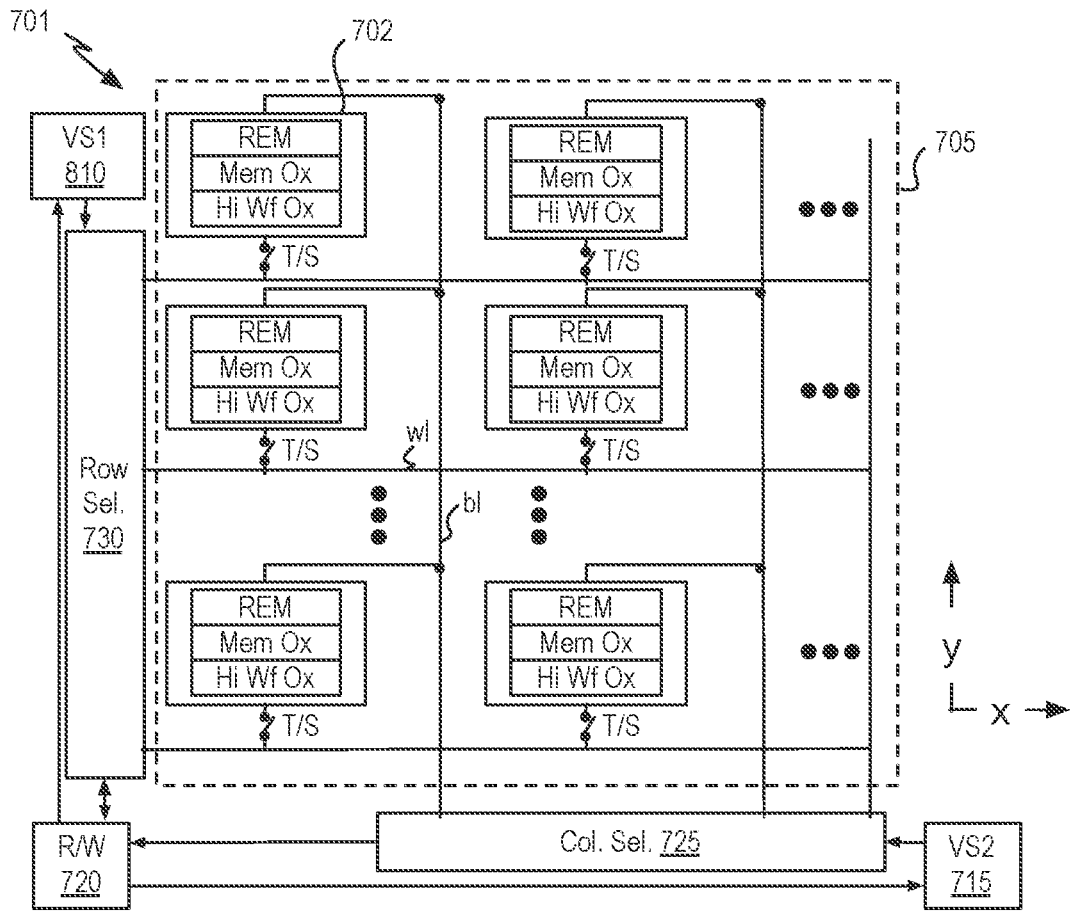
FIG. 7 is a schematic of a NVM including a plurality of thin film memory bitcells, in accordance with embodiments.

FIG. 7 is a schematic of a NVM 701 including a plurality of thin film resistive memory stacks 702, each incorporating a metal oxide high work function electrode material and a rare earth metal capping layer, in accordance with embodiments. Each stack 702 includes a bidirectional memory material (M) and interfaced with a rare earth metal (MEM) capping layer and a high work function electrode material in conformance with any of the embodiments described elsewhere herein. Array 705 is a bidirectional cross point array including any number of independent memory stacks 702, each stack coupled through an access transistor ("T") or thin film resistive selector element ("S"). Each column is associated with a bitline driven by a column select circuit in column select circuitry 725. Each row is associated with a wordline driven by a row select circuit in row select circuitry 730. In an operative state, R/W control circuitry 720 receives memory access requests (e.g., from a local processor or communication chip in which the memory is embedded), generates the requisite control signals based on the requests (e.g., read, write 0, or write 1), and controls the row and column select circuitry 725, 730. Voltage supplies 710, 715 are controlled to provide the voltage necessary to bias the array to facilitate the requested action on one or more bitcell 702. Row and column select circuitry 725, 730 applies the supplied voltage across array 705 to access selected bitcell(s). Row select circuitry 725, column select circuitry 730, and R/W control circuitry 720 may be implemented with any known technology. In one exemplary embodiment, the maximum supply voltage that is available from voltage supplies 710, 715 for a write operation is less than 1.5 volt.

Figure 8:
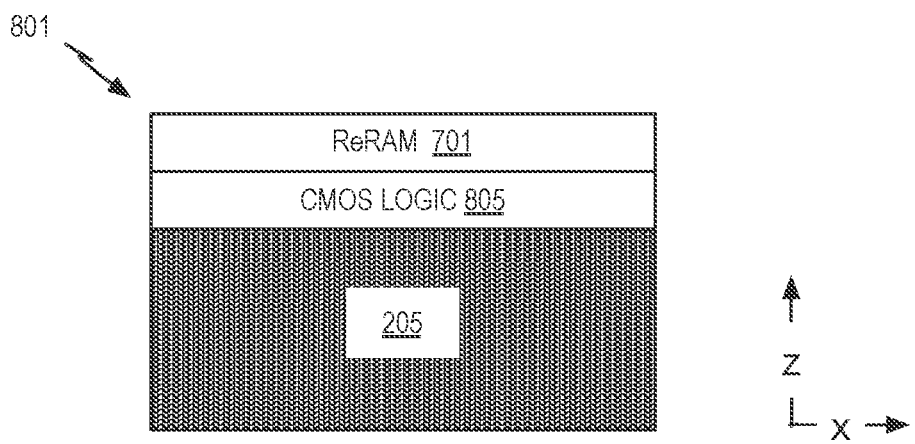
FIG. 8 illustrates a cross-section of e-NVM, in accordance with embodiments.

FIG. 8 illustrates a cross-section of e-NVM 801, in accordance with exemplary embedded resistive memory embodiments. As illustrated, e-NMV 801 includes NVM 701 monolithically integrated with CMOS logic 805 over substrate 205. In this exemplary embodiment, NVM 701 (including a plurality of thin film stacks, each incorporating one or more of a high work function metal oxide electrode material, or rare earth metal capping layer) is disposed over CMOS logic 905, for example as part of a BEOL film stack. CMOS logic 905 may include any metal-oxide-semiconductor transistors known (e.g. MOSFETs), one or more of which is electrically coupled to NVM 701 to implement R/W control circuitry, voltage supplies, row/column select circuitry, etc.

Figure 9:
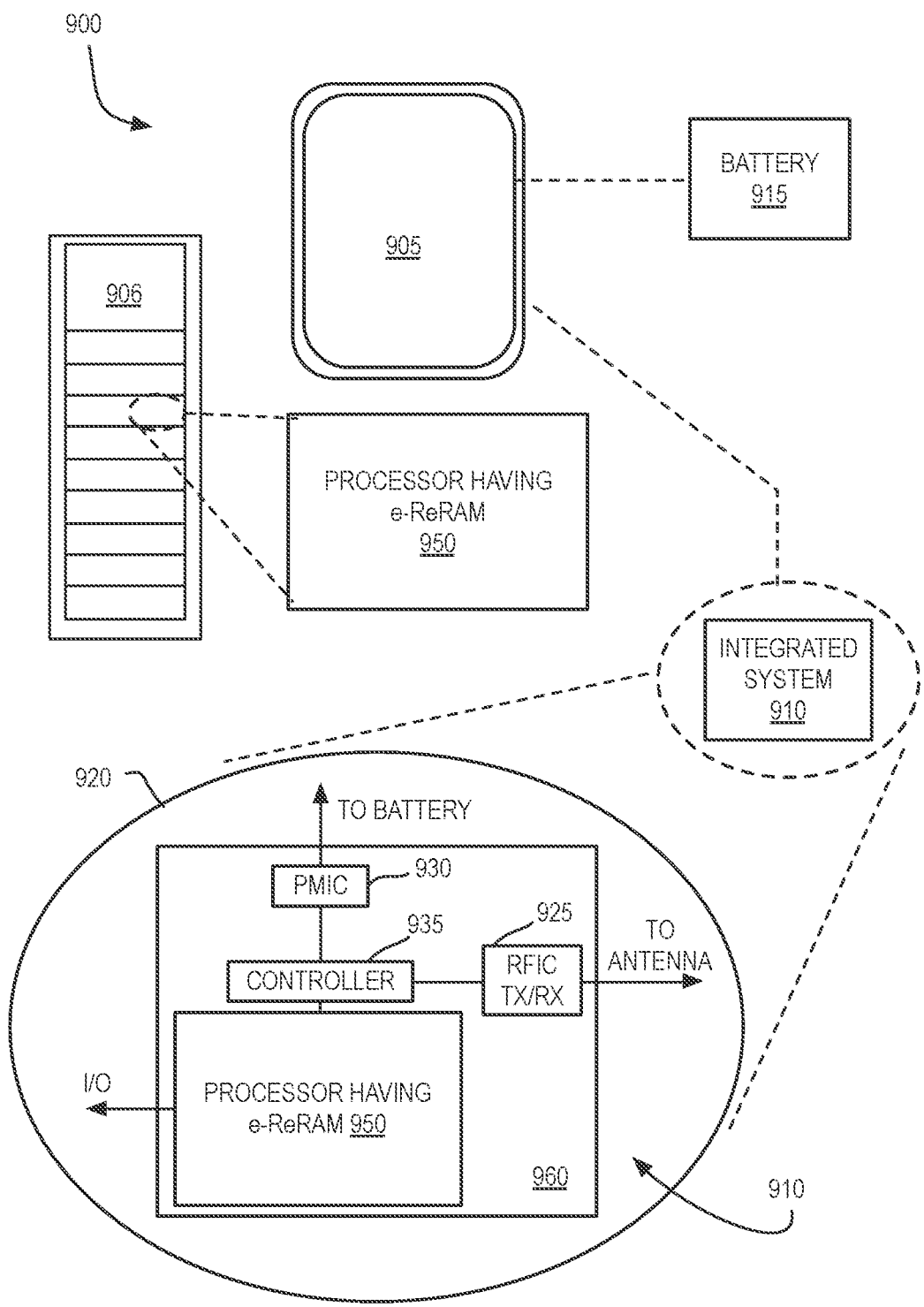
FIG. 9 illustrates a mobile computing platform and a data server machine employing an SoC having e-NVM with thin film resistive memory stacks in accordance with embodiments.

FIG. 9 illustrates a mobile computing platform and a data server machine employing an SoC having e-NVM (e.g., ReRAM) with thin film resistive memory stacks incorporating one or more of a high work function metal oxide electrode material, or rare earth metal capping layer, in accordance with embodiments of the present invention. The server machine 906 may be any commercial server, for example including any number of high-performance computing platforms disposed within a rack and networked together for electronic data processing, which in the exemplary embodiment includes a packaged monolithic IC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone packaged chip within the server machine 906, packaged monolithic IC 950 includes a memory chip (e.g., RAM), or a processor chip (e.g., a microprocessor, a multi-core microprocessor, graphics processor, or the like) including at least one ReRAM with thin film resistive memory stacks incorporating one or more of a high work function metal oxide electrode material or rare earth metal capping layer, for example as described elsewhere herein. The monolithic IC 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller thereof 935.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 950 or within a single IC coupled to the package substrate of the monolithic IC 950.

Figure 10:
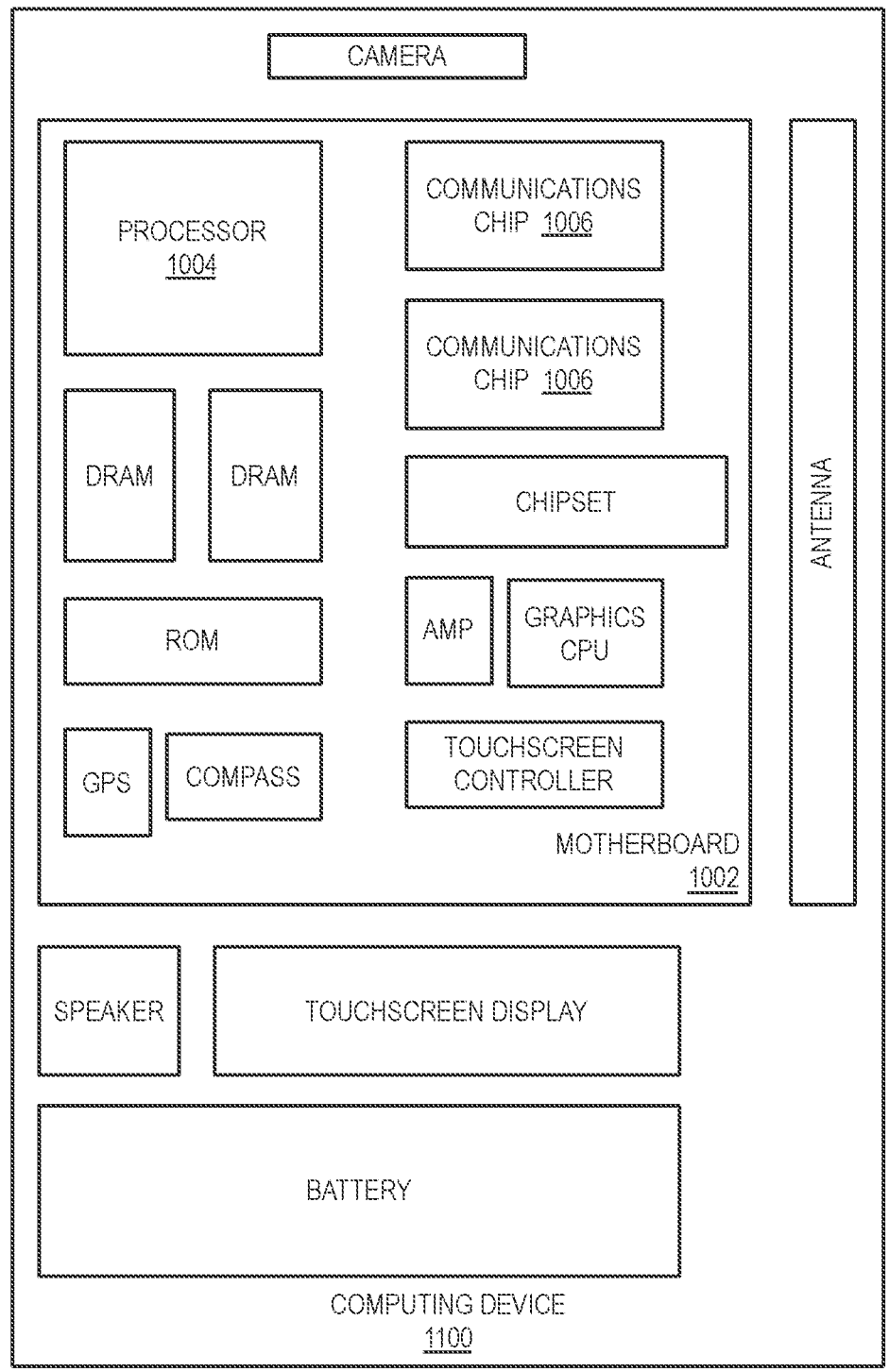
FIG. 10 is a functional block diagram of an electronic computing device, in accordance with an embodiment of the present invention.

FIG. 10 is a functional block diagram of a computing device 1000, arranged in accordance with at least some implementations of the present disclosure. Computing device 1000 may be found inside platform 905 or server machine 906, for example. Device 1000 further includes a motherboard 1002 hosting a number of components, such as, but not limited to, a processor 1004 (e.g., an applications processor), which may further incorporate at least one ReRAM with thin film resistive memory stacks incorporating one or more of a high work function metal oxide electrode material or rare earth metal capping layer, for example as described elsewhere herein. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the inventive scope is not limited to the embodiments so described, but can be practiced with modification and alteration without departing from the scope of the appended claims. For example the above embodiments may include specific combinations of features as further provided below.

In one or more first embodiment, a resistive thin film memory stack includes a substrate, a first and second electrode material disposed over the substrate, and a thin film memory material disposed between the first and second electrode materials that is to undergo a non-volatile transition between low and high resistance states at a set/reset voltage applied across the first and second electrodes. The memory stack further includes at least one of a capping material comprising a rare earth metal having a work function below 4.5 eV disposed between the memory material and the first electrode material, or a work function electrode material comprising a metal oxide having a work function above 4.8 eV disposed between the memory material and the second electrode.

In furtherance of the first embodiments, the memory material comprises an oxide of a transition metal. At least one of the capping material and work function electrode material is in direct contact with the transition metal oxide.

In furtherance of the embodiment immediately above, the capping material is in direct contact with a first interface of the transition metal oxide. The work function electrode material in direct contact with a second interface of the transition metal oxide.

In furtherance of the embodiment immediately above, the work function electrode material is in direct contact with the first electrode material, and the capping material is in direct contact with the second electrode material.

In furtherance of the first embodiments, the memory oxide comprises at least one of Hf, Ta, Ti, Al, W, or Zr.

In furtherance of the embodiment immediately above, the work function electrode material is in direct contact with the memory element, the work function electrode material is in direct contact with the first electrode material, and the work function electrode material has a film thickness no more than 5 nm.

In furtherance of the first embodiments, the capping material comprises at least one of La, Er, Ga, Y, or Pr, and the work function electrode material comprises an oxide of at least one of Ir, Ru, Mo, or W.

In furtherance of the embodiment immediately above, the capping material is an elemental metal of La, Er, Ga, Y, or Pr, and the work function electrode material is an elemental oxide.

In furtherance of the embodiment above, the capping material is an oxide of at least two of La, Er, Ga, Y, or Pr, and the work function electrode material is an oxide of at least two of Ir, Ru, Mo, or W.

In furtherance of the embodiment above, the capping material is in direct contact with the memory material. The capping material is in direct contact with the second electrode material, and the interface of the capping material and second electrode material is free of oxygen.

In one or more second embodiment, a system on chip (SoC) includes a resistive memory array including a plurality of resistive memory bitcells, each bitcell further including an access MOSFET or thin film selector element disposed over a substrate, and a thin film memory stack electrically coupled to the access MOSFET or selector element. The thin film memory stack further includes a first and second electrode material disposed over the substrate. The thin film memory stack further includes a thin film memory material disposed between the first and second electrode materials, and the memory material is to undergo a non-volatile transition between low and high resistance at a set/reset voltage. The thin film memory stack further includes at least one of a capping material comprising a rare earth metal and having a work function below 4.5 eV disposed between the memory material and the first electrode material, or a work function electrode material comprising a metal oxide and having a work function above 4.8 eV disposed between the memory material and the second electrode.

In furtherance of the second embodiments, the SoC further includes a plurality of MOS transistors disposed over the substrate, one or more of the plurality of transistors electrically coupled to the resistive memory array.

In one or more third embodiments, a method of fabricating a resistive memory cell includes depositing a first electrode material over a substrate. The method includes forming, over the first electrode material, a work function electrode material comprising a metal oxide. The method includes depositing a thin film memory material directly on the work function electrode material, the thin film memory material to undergo a non-volatile transition between low and high resistance at a set/reset voltage applied across the first and second electrodes. The method further includes depositing a capping material comprising a rare earth metal directly on the thin film memory. The method further includes depositing a second electrode material over the capping material.

In furtherance of the third embodiments, forming the work function electrode material further includes depositing the metal oxide directly on the first electrode material, the metal oxide having a work function above 4.8 eV. Depositing the capping material further includes depositing a rare earth metal having a work function below 4.5 eV.

In furtherance of the embodiment immediately above, depositing the metal oxide further includes depositing an oxide of at least one of Ir, Ru, Mo, or W, and depositing the rare earth metal further includes depositing at least one of La, Er, Ga, Y, or Pr.

In furtherance of the embodiment immediately above, depositing the metal oxide further includes depositing an elemental oxide of one of Ir, Ru, Mo, or W. Depositing the rare earth metal further includes depositing an elemental metal of La, Er, Ga, Y, or Pr; and depositing the thin film memory material comprises depositing a transition metal oxide.

In furtherance of the third embodiments, depositing the metal oxide further includes depositing an oxide of two or more of Ir, Ru, Mo, or W. Depositing the rare earth metal further includes depositing an alloy of two or more of La, Er, Ga, Y, or Pr, and depositing the thin film memory material includes depositing a transition metal oxide.

In furtherance of the third embodiments, the method further includes depositing a laminate stack of a plurality of metal layers insulated from each other by an intervening dielectric. The method further includes etching through the laminate stack, forming a topographic feature exposing a sidewall of the plurality of metal layers. Depositing the work function electrode material further includes depositing the metal oxide over the topographic feature in direct contact with the sidewall of the plurality of metal layers. Depositing the memory material further includes depositing a transition metal oxide over the topographic feature and in direct contact with the work function electrode material. Depositing the capping material further includes depositing the rare earth metal over the topographic feature and in direct contact with the memory material.

In furtherance of the third embodiments, depositing the work function electrode further comprises depositing the metal oxide to a thickness no more than 5 nm.

In furtherance of the third embodiments, depositing the memory material further comprise depositing an oxide of at least one of Hf, Ta, Ti, Al, W, or Zr.

However, the embodiments are not limited to the examples above, and in various implementations the above embodiments may include the undertaking only a subset of such features, undertaking a different order of such features, undertaking a different combination of such features, and/or undertaking additional features than those features explicitly listed. The inventive scope should, therefore, be determined with reference to the appended claims, along with the full scope of equivalents to which such claims are entitled.

What is claimed is:

1. A resistive thin film memory stack, comprising:
   a substrate;
   first and second electrode materials over the substrate;
   a thin film memory material between the first and second electrode materials, the thin film memory material comprising oxygen and a transition metal, and to undergo a non-volatile transition between low and high resistance states at a set/reset voltage applied across the first and second electrode materials; and
   a capping material comprising a rare earth metal having a work function below 4.5 eV, the capping material between the thin film memory material and the first electrode material.

2. The resistive thin film memory stack of claim 1, wherein:
   the thin film memory material comprises an oxide of a transition metal; and
   the capping material is in direct contact with the transition metal oxide.

3. The resistive thin film memory stack of claim 2, comprising:
   a work function electrode material in direct contact with a second interface of the transition metal oxide, wherein the work function electrode material comprises a metal oxide having a work function above 4.8 eV.

4. The resistive thin film memory stack of claim 3, wherein:
   the work function electrode material is in direct contact with the first electrode material; and
   the capping material is in direct contact with the second electrode material.

5. The resistive thin film memory stack of claim 3, wherein:
   the memory oxide comprises at least one of Hf, Ta, Ti, Al, W, or Zr.

6. The resistive thin film memory stack of claim 5, wherein:
   the work function electrode material is in direct contact with the memory element;
   the work function electrode material is in direct contact with the second electrode material; and
   the work function electrode material has a film thickness no more than 5 nm.

7. The resistive thin film memory stack of claim 3, wherein:
   the capping material comprises at least one of La, Er, Ga, Y, or Pr; and the work function electrode material comprises an oxide of at least one of Ir, Ru, Mo, or W.

8. The resistive thin film memory stack of claim 7, wherein:
the capping material is an elemental metal of La, Er, Ga, Y, or Pr; and
the work function electrode material is an elemental oxide.

9. The resistive thin film memory stack of claim 7, wherein:
the capping material is an oxide of at least two of La, Er, Ga, Y, or Pr; and
the work function electrode material is an oxide of at least two of Ir, Ru, Mo, or W.

10. The resistive thin film memory stack of claim 7, wherein:
the capping material is in direct contact with the thin film memory material;
the capping material is in direct contact with the first electrode material; and the interface of the capping material and first electrode material is free of oxygen.

11. A system on chip (SoC), comprising:
a resistive memory array including a plurality of resistive memory bitcells, each bitcell further including:
an access MOSFET or thin film selector element disposed over a substrate; and
a thin film memory stack electrically coupled to the access MOSFET or selector element, wherein the thin film memory stack further comprises:
first and second electrode materials over the substrate;
a thin film memory material between the first and second electrode materials, the thin film memory material comprising oxygen and a transition metal, and to undergo a non-volatile transition between low and high resistance at a set/reset voltage;
and
a capping material comprising a rare earth metal and having a work function below 4.5 eV, the capping material between the thin film memory material and the first electrode material.

12. The SoC of claim 11, further comprising a plurality of MOS transistors over the substrate, one or more of the plurality of transistors electrically coupled to the resistive memory array.

* * * * *